(12) United States Patent
Ranish (10) Patent No.: US 10,327,284 B2
(45) Date of Patent: Jun. 18, 2019

(54) DIFFUSER FOR LAMP HEATING ASSEMBLY

(71) Applicant: Applied Materials, Inc., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 355 days.

(21) Appl. No.: 14/254,578

(22) Filed: Apr. 16, 2014

(65) Prior Publication Data

US 2014/0341551 A1 Nov. 20, 2014

Related U.S. Application Data

(60) Provisional application No. 61/823,641, filed on May 15, 2013.

(51) Int. Cl.
*F21V 9/00* (2018.01)
*H05B 3/00* (2006.01)
*H01L 21/67* (2006.01)

(52) U.S. Cl.
CPC ...... *H05B 3/0047* (2013.01); *H01L 21/67115* (2013.01)

(58) Field of Classification Search
None
See application file for complete search history.

(56) References Cited

U.S. PATENT DOCUMENTS

| | | | |
|---|---|---|---|
| 5,577,157 A | 11/1996 | Sopori | |
| 6,437,290 B1 | 8/2002 | Shao et al. | |
| 6,849,831 B2 * | 2/2005 | Timans | C30B 31/12 118/50.1 |
| 6,862,404 B1 | 3/2005 | Yoo | |
| 7,509,035 B2 * | 3/2009 | Ranish | H01L 21/67115 118/50.1 |
| 8,111,978 B2 | 2/2012 | Sorabji et al. | |
| 8,295,691 B2 * | 10/2012 | Kusuda | H01L 21/67115 392/407 |
| 2002/0030047 A1 * | 3/2002 | Shao | C23C 16/481 219/390 |

(Continued)

FOREIGN PATENT DOCUMENTS

| | | |
|---|---|---|
| CN | 102210017 A | 10/2011 |
| JP | 2000-349038 A | 12/2000 |

(Continued)

OTHER PUBLICATIONS

International Search Report and Written Opinion dated Aug. 26, 2014 for Application No. PCT/US2014/034201.

(Continued)

*Primary Examiner* — Thor S Campbell
(74) *Attorney, Agent, or Firm* — Patterson + Sheridan LLP (57) ABSTRACT

Embodiments of the present disclosure generally relate to optically transparent windows and processing chambers including the same. The optically transparent window includes light-diffusing structures formed thereon. The light diffusing structures may include a scalloped or dimpled surface having protruding or indented features, or a frosted surface. The light-diffusing structures facilitate more uniform heating of substrates by reducing thermal hot spots caused by uneven irradiation by lamps.

13 Claims, 4 Drawing Sheets

(56) References Cited

U.S. PATENT DOCUMENTS

2010/0133257 A1    6/2010    Sorabji et al.
2011/0008740 A1    1/2011    Sorabji et al.
2014/0376897 A1*   12/2014    Ranish ............ H01L 21/67109
                                                                                                         392/416

FOREIGN PATENT DOCUMENTS

JP        2004-031867 A    1/2004
KR    10-2003-0003780    1/2003

OTHER PUBLICATIONS

Chinese Office Action dated May 29, 2018 for Application No. 201480025323.4.
Chinese Office Action dated Oct. 26, 2017 for Application No. 201480025323.4.
Chinese Office Action dated Oct. 9, 2018 for Application No. 201480025323.4.
Taiwan Office Action dated Oct. 3, 2018 for Application No. 107105175.

* cited by examiner

DIFFUSER FOR LAMP HEATING ASSEMBLY

CROSS-REFERENCE TO RELATED APPLICATIONS

This application claims benefit of U.S. Provisional Patent Application Ser. No. 61/823,641, filed May 15, 2013, which is herein incorporated by reference.

BACKGROUND OF THE DISCLOSURE

Field of the Disclosure

Embodiments of the disclosure generally relate to thermally treating substrates, such as semiconductor substrates.

Description of the Related Art

Rapid thermal processing (RTP) chambers commonly utilize lamps to provide thermal energy to a substrate. The lamps are arranged in lamp heads, and the energy from the lamps is directed towards a substrate or substrate support within a processing chamber to provide thermal energy to the substrate. The radiant energy from the lamps overlaps the substrate or the substrate support in uneven or non-uniform patterns, due to, for example, geometry of the lamp arrangement, chamber or lamp features, or the geometry of the field emitted by each lamp. Moreover, the irradiance patterns of each individual lamp are often not uniform. For example, some lamps may deliver more thermal energy to a central portion of a respective irradiance pattern compared to an outer portion of the irradiance pattern. The uneven irradiance results in uneven heating of the substrate, adversely affecting substrate uniformity.

Therefore, there is a need for more uniform irradiance of substrates.

SUMMARY OF THE DISCLOSURE

Embodiments of the present disclosure generally relate to optically transparent windows and processing chambers including the same. The optically transparent window includes light-diffusing structures formed thereon. The light diffusing structures may include a scalloped or dimpled surface having protruding or indented features, or a frosted surface. The light-diffusing structures facilitate more uniform heating of substrates by reducing thermal hot spots caused by uneven irradiation by lamps.

In one embodiment, a processing chamber comprises a chamber body, a substrate support positioned within the chamber body and adapted to support a substrate in a support plane, and a radiant heat source disposed within the chamber body to direct radiant heat towards the support plane. An optically transparent window is disposed between the substrate support plane and the radiant heat source. The optically transparent window includes one or more light diffusing structures thereon.

In another embodiment, a processing chamber comprises a chamber body, a substrate support positioned within the chamber body and adapted to support a substrate in a plane, and a radiant heat source disposed within the chamber body beneath the substrate support plane. An optically transparent window is disposed between the substrate support plane and the radiant heat source. The optically transparent window includes one or more light diffusing structures thereon.

In another embodiment, a processing chamber comprises a chamber body, a substrate support positioned within the chamber body, and a radiant heat source disposed within the chamber body to direct radiant heat towards the substrate support. An optically transparent window is disposed between the substrate support and the radiant heat source. The optically transparent window includes one or more light diffusing structures thereon.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optically transparent windows and processing chambers including the same. The optically transparent window includes light-diffusing structures formed thereon. The light diffusing structures may include a scalloped or dimpled surface having protruding or indented features, or a frosted surface. The light-diffusing structures facilitate more uniform heating of substrates by reducing thermal hot spots caused by uneven irradiation by lamps.

Figure 1:
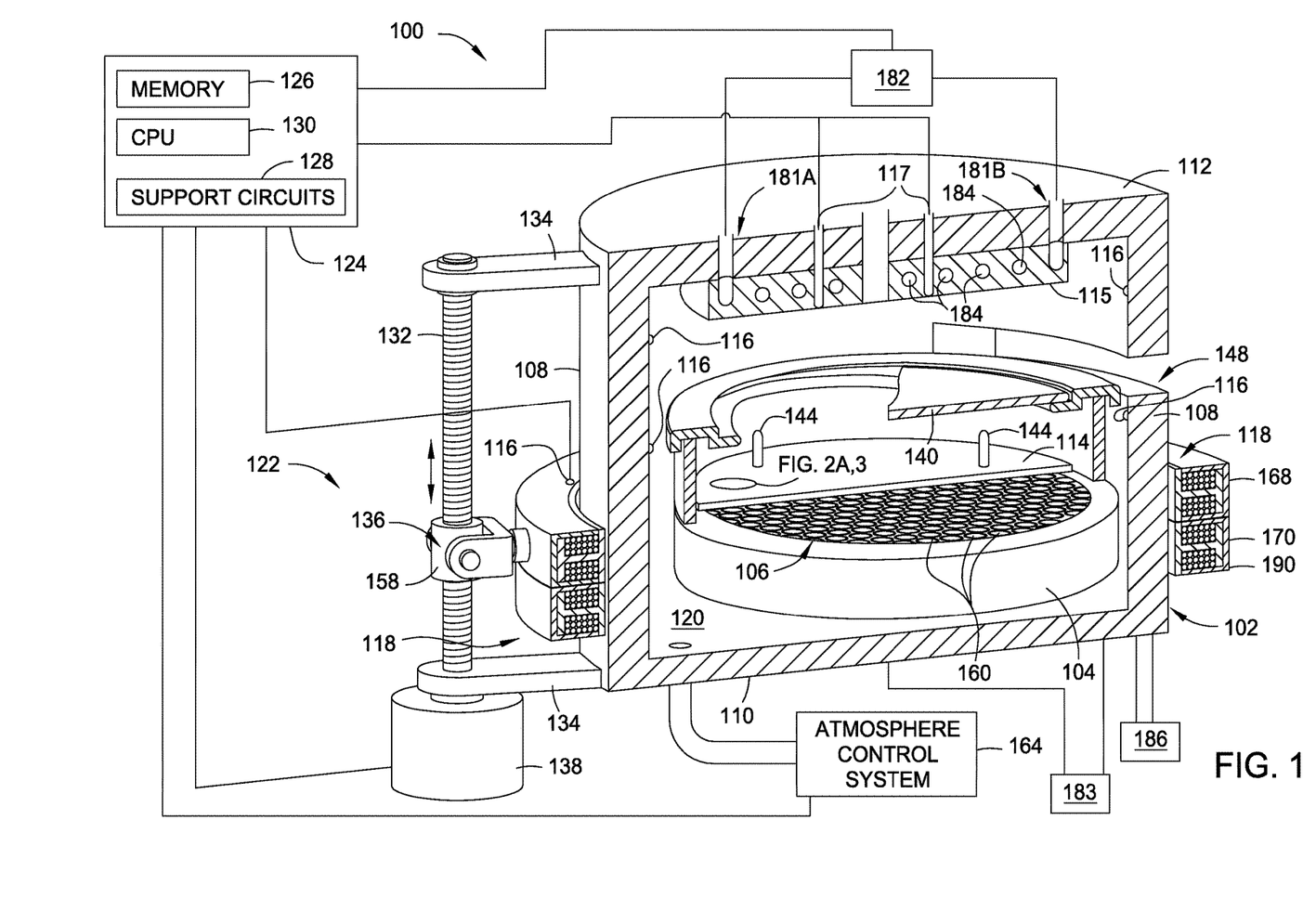
FIG. 1 illustrates a sectional view of a processing chamber, according to one embodiment of the disclosure.

FIG. 1 illustrates a sectional view of a processing chamber 100, according to one embodiment of the disclosure. The processing chamber 100 may be an RTP chamber and includes a substrate support 104, a chamber body 102 having walls 108, a bottom 110, and a top 112 defining an interior volume 120. The walls 108 may include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). In one embodiment, the substrate support 104 is annular and the chamber 100 includes a radiant heat source 106 disposed in an inside diameter of the substrate support 104. The radiant heat source 106 may be, for example, a lamp head and may comprise a plurality of lamps. In one embodiment of the disclosure, the chamber 100 includes a plate 115 incorporating gas distribution outlets to distribute gas evenly over a substrate to allow rapid and controlled heating and cooling of the substrate.

The plate 115 may be absorptive, reflective, or have a combination of absorptive and reflective regions. In one embodiment, the plate 115 may have regions, some within view of the pyrometers, some outside the view of the pyrometers. The regions within view of the pyrometers may be about one inch in diameter, if circular, or other shape and size as necessary. The regions within view of the probes may be very highly reflective over the wavelength ranges observed by the pyrometers. Outside the pyrometer wavelength range and field of view, the plate 115 can range from reflective to minimize radiative heat loss, to absorptive to maximize radiative heat loss to allow for shorter thermal exposure.

The plate 115 is spaced apart and opposing the radiant heat source 106. The plate 115 comprises one or more coolant channels 184 coupled to an inlet 181A and an outlet 181B. The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat-exchange medium.

In the embodiment shown, the substrate support 104 is optionally adapted to magnetically levitate and rotate within the interior volume 120. The substrate support 104 shown is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

The processing chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire. The window 114 may also include a plurality of lift pins 144 coupled to an upper surface of the window 114, which are adapted to selectively contact and support the substrate 140, to facilitate transfer of the substrate into and out of the chamber 100. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

In one embodiment, the radiant heat source 106 includes a lamp assembly formed from a housing which includes a plurality of honeycomb tubes 160 in a coolant assembly coupled to a second coolant source 183. The second coolant source 183 may be one or a combination of water, ethylene glycol, nitrogen ($N_2$), and helium (He). The housing walls 108 and bottom 110 may be made of a copper material or other suitable material having suitable coolant channels formed therein for flow of the coolant from the second coolant source 183. The coolant cools the housing of the chamber 100 so that the housing is cooler than the substrate 140. Each tube 160 may contain a reflector and a high-intensity lamp assembly or an IR emitter from which is formed a honeycomb like pipe arrangement. This close-packed hexagonal arrangement of pipes provides radiant energy sources with high power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by controller 124 may varied to enhance the radial distribution of energy from the tubes 160. Dynamic control of the heating of the substrate 140 may be effected by the one or more temperature sensors 117 adapted to measure the temperature across the substrate 140.

In the embodiment shown, an optional stator assembly 118 circumscribes the walls 108 of the chamber body 102 and is coupled to one or more actuator assemblies 122 that control the elevation of the stator assembly 118 along the exterior of the chamber body 102. In one embodiment, the chamber 100 includes three actuator assemblies 122 disposed radially about the chamber body, for example, at about 120 degree angles about the chamber body 102. The stator assembly 118 is magnetically coupled to the substrate support 104 disposed within the interior volume 120 of the chamber body 102. The substrate support 104 may comprise or include a magnetic portion to function as a rotor, thus creating a magnetic bearing assembly to lift and/or rotate the substrate support 104. In one embodiment, at least a portion of the substrate support 104 is partially surrounded by a trough (not shown) that is coupled to a fluid source 186, which may include water, ethylene glycol, nitrogen ($N_2$), helium (He), or combinations thereof, adapted as a heat exchange medium for the substrate support. The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100. Alternatively, the rotational and centering functions may be performed by a stator having a single coil assembly.

In one embodiment, each of the actuator assemblies 122 generally comprise a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator assembly 118 and nut 158 so that as the lead screw 132 is rotated, the coupling 136 is moved along the lead screw 132 to control the elevation of the stator assembly 118 at the interface with the coupling 136. Thus, as the lead screw 132 of one of the actuators 122 is rotated to produce relative displacement between the nuts 158 of the other actuators 122, the horizontal plane of the stator assembly 118 changes relative to a central axis of the chamber body 102.

In one embodiment, a motor 138, such as a stepper or servo motor, is coupled to the lead screw 132 to provide controllable rotation in response to a signal by the controller 124. Alternatively, other types of actuators 122 may be utilized to control the linear position of the stator assembly 118, such as pneumatic cylinders, hydraulic cylinders, ball screws, solenoids, linear actuators and cam followers, among others.

An atmosphere control system 164 is also coupled to the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes, thermal etch processes, and in-situ cleaning of chamber components. The atmosphere control system works in conjunction with the showerhead gas delivery system.

The processing chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is coupled to the CPU 130. The support circuits 128 are coupled to the CPU 130 for supporting the controller 124 in a conventional manner. These circuits include cache, power supplies, clock circuits, input/output circuitry, subsystems, and the like.

The processing chamber 100 also includes one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator assembly 118 at each actuator assembly 122 so that both the elevation and the planarity of the substrate support 104 and substrate 140 seated thereon may be adjusted relative to and a central axis of the processing chamber 100 and/or the radiant heat source 106. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top 112 or contacting the walls 108, although other locations within and around the chamber body 102 may be suitable, such as coupled to the stator assembly 118 outside of the chamber 100. In one embodiment, one or more sensors 116 are coupled to the stator assembly 118 and are adapted to sense the elevation and/or position of the substrate support 104 (or substrate 140) through the walls 108. In this embodiment, the walls 108 may include a thinner cross-section to facilitate positional sensing through the walls 108.

The processing chamber 100 also includes one or more temperature sensors 117, which may be adapted to sense a temperature of the substrate 140 before, during, and after processing. The temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment, a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

Although the plate 115 and radiant heat source 106 is described as being positioned in an upper and lower portion of the interior volume 120, respectively, the position of the plate 115 and radiant heat source 106 may be reversed. For example, the plate 115 may be sized and configured to be positioned within the inside diameter of the substrate support 104, and the radiant heat source 106 may be coupled to the top 112. In this arrangement, the quartz window 114 may be disposed between the radiant heat source 106 and the substrate support 104, such as adjacent the radiant heat source 106 in the upper portion of the processing chamber 100. Although the substrate 140 may absorb heat readily when the backside is facing the radiant heat source 106, the substrate 140 could be oriented in a face-up orientation or a face down orientation in either configuration.

Figure 2A:
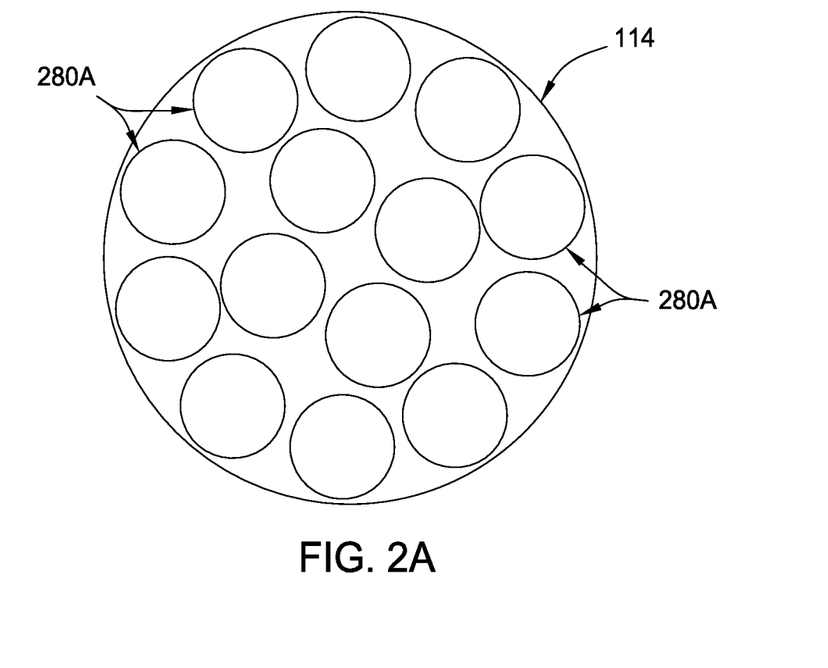
FIGS. 2A-2C illustrate light-diffusing structures according to embodiments of the disclosure.
Figure 2B:
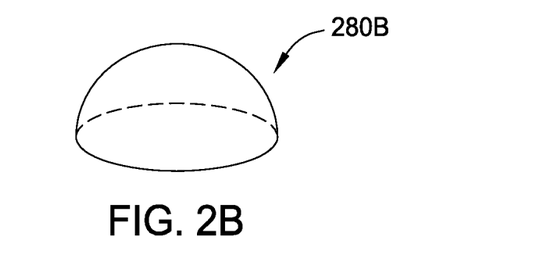
Figure 2C:
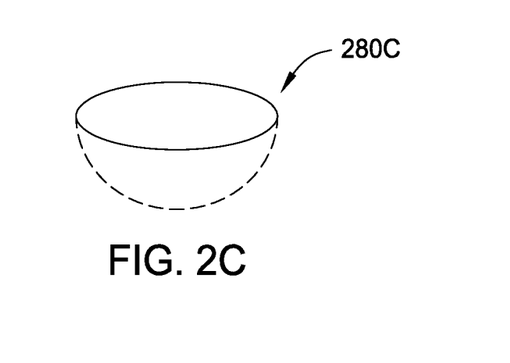

FIGS. 2A-2C illustrate light-diffusing structures according to embodiments of the disclosure. FIG. 2A illustrates an enlarged partial view of the window 114 shown in FIG. 1. The window 114 includes light-diffusing structures 280A thereon. In one embodiment, the light-diffusing structures 280A are disposed on the upper surface of the window 114. The light-diffusing structures 280A diffuse radiant energy emitted from a radiant heat source (such as radiant heat source 106 shown in FIG. 1). In one example, the light-diffusing structures 280A may reduce the amount of radiant energy transmitted through the window 114 by about 20 percent or less. The diffusing of radiant energy facilitates a reduction in hot spots or temperature non-uniformity across a substrate during a thermal process, for example, by reducing non-uniform radiation such as undesired lamp irradiation overlap or non-uniformities caused by an individual lamp's non-uniform irradiance pattern.

Figure 4:
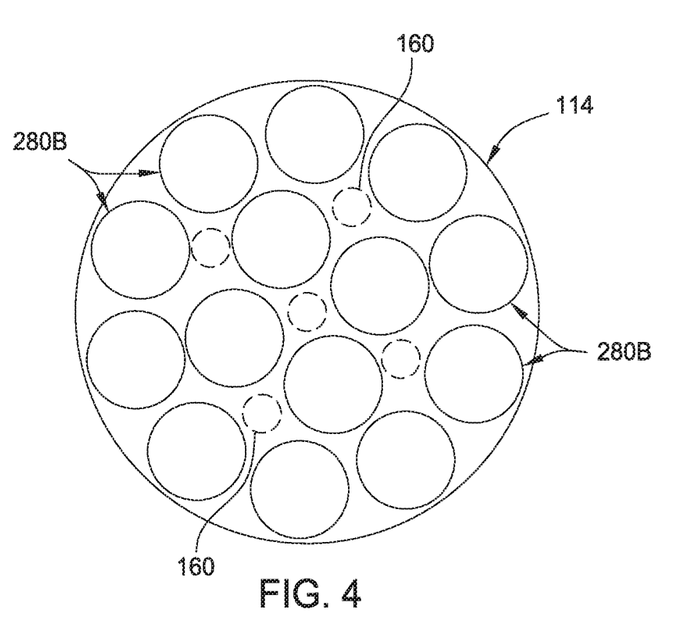
FIG. 4 illustrates a plan view of the window with light diffusing structures disposed thereon.

In one embodiment, temperature non-uniformities on a substrate may be empirically determined or estimated using modeling software, and then a window 114 may be designed with light-diffusing structures 280A to reduce the temperature non-uniformities. The light-diffusing structures 280A may be disposed over one or more lamps individually, or may be disposed over substantially the entire surface of the window 114. The light-diffusing structures 280A may be, for example, convex lenses, concave lenses, Fresnel lenses, protrusions, indented dimples, or frosting on the window 114. FIGS. 2B, 2C illustrate exemplary light diffusing structures which may be utilized in place of the light-diffusing structure 280A. FIG. 4 illustrates a plan view of the window 114 with the light diffusing structures 280B disposed thereon and indexed to accommodate the tubes 160 (shown in phantom below the window 114) therebetween.

FIG. 2B illustrates a light-diffusing structure 280B according to one embodiment of the disclosure. The light-diffusing structure 280B is a protrusion, such as a protruding dome, which extends from a surface of a window 114. The light-diffusing structure 280B diffuses or redistributes light from a radiant heat source, such as lamp, to facilitate a more uniform irradiance of a substrate. In one example, the light diffusing structure 280B may have a height and/or radius of about 1 millimeter (mm) to about 10 mm and a spacing of about 0.1 mm to about 2 mm.

FIG. 2C illustrates a light-diffusing structure 280C according to one embodiment of the disclosure. The light-diffusing structure 280C is a negative dimple that is indented into a window 114. In one example, the light diffusing structure 280C may be indented and/or have a radius of about 1 millimeter (mm) to about 10 mm. Indented dimples may be spaced about 0.1 mm to about 2 mm from one another. The light-diffusing structures 280C may be formed, for example, by laser cutting the window 114.

FIGS. 2A-2C illustrate some embodiments of light-diffusing structures; however, additional embodiments are also contemplated. In another embodiment, it is contemplated that light-diffusing structures may be disposed on the top surface of the window 114, on the bottom surface of the window 114, or on both the top surface and the bottom surface of the window 114. When light-diffusing structures 280B are disposed on the lower surface of the window 114, it is desirable to position the light-diffusing structures 280B to accommodate lamps positioned adjacent thereto. For example, the light diffusing structures 280B may be indexed to accommodate tubes 160 (shown in FIG. 1) therebetween. In another embodiment, it is contemplated that the size and density of the light-diffusing structures may be varied. In one example, the size and density of the light diffusing structures may be selected to provide a 10-20 degree Gaussian diffusion. Additionally, the light-diffusing structures may be localized over one or more lamps, for example in discrete groups, or the light-diffusing structures may cover substantially an entire surface of the window 114.

In one example, one or more light-diffusing structures may be positioned centrally over each lamp within a radiant heat source. Such an embodiment reduces hot spots formed on a substrate directly above a lamp due to higher energy outputs near the center of an irradiance pattern of a lamp. In a processing chamber lacking light-diffusing structures, radial hotspots form at particular radii around the substrate as the substrate rotates during processing because the central hotspots of each lamp fall on common radii. Thus, rotation of the substrate is unable to reduce the hotspots due to inherent non-uniformity of lamp output. However, discrete placement of light-diffusing structures over select lamps can reduce the hot spots (or radial hot spots) formed by lamps during processing.

Table 1 illustrates a comparison of relative standard deviations of irradiance over a rotated substrate. Table 1 provides a comparison between a planar window 114 (no light-diffusing feature), a window 114 having light-diffusing structure 280B on an upper surface thereof, and a window 114 having light-diffusing structures 280C on an upper surface thereof. The light-diffusing structure 280B has a height of about 1.5 mm and a spacing of about 0.1 mm, while the light-diffusing structure 280C has a depth of about 1.5 mm and a spacing of about 0.1 mm. The spacing between the lamps and the substrate may be about 10 mm to about 50 mm, such as about 20 mm to about 30 mm. As shown, lower relative standard deviations (e.g., more uniform irradiance) are obtainable using light-diffusing structures.

| | Distance between lamps and substrate (mm) | | | | |
|---|---|---|---|---|---|
| Light-diffusing structure | 10 | 20 | 30 | 40 | 50 |
| None | 4.4% | 2.3% | 3.3% | 4.3% | 4.9% |
| Positive protrusions (280B) | 5.3% | 2.3% | 1.9% | 2.0% | 2.1% |
| Indents (280C) | 4.6% | 1.6% | 1.3% | 1.5% | 1.7% |

Figure 3:
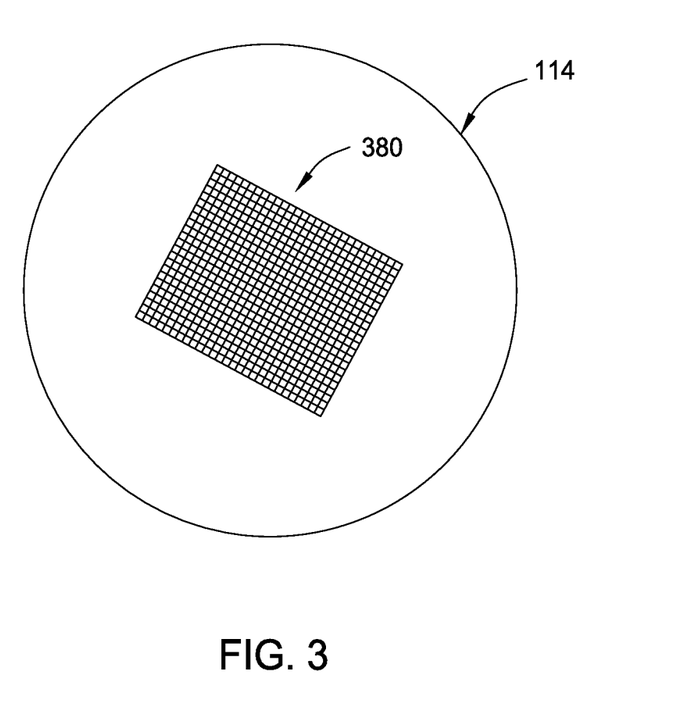
FIG. 3 illustrates an enlarged partial view of a window having a light-diffusing structure according to another embodiment of the disclosure.

FIG. 3 illustrates an enlarged partial view of a window 114 having a light-diffusing structure 380 according to another embodiment of the disclosure. The light-diffusing structure 380 is texturing applied to the window 114 to form a frosted glass, and may be applied to a bottom surface (e.g., adjacent the lamps) or a top surface (e.g., opposite the lamps) of the window 114. As illustrated, the light-diffusing structure 380 is localized on the window 114, e.g., above a single lamp. However, it is contemplated that substantially an entire surface of the window 114 may be frosted. Either the top surface of the window 114, the bottom surface of the window 114, or both surfaces of the window 114 may be frosted.

In one example, light-diffusing structures 380 are formed over discrete portions of the window 114. To facilitate formation of the discrete light-diffusing structures 380, a surface of the window 114 is coated with a wax or other etchant-resistant material in a desired pattern. Exposed portions of the window 114 are then exposed to an etchant, such as hydrogen fluoride (HF), for a predetermined time to cause etching of the window 114, resulting in frosted window. The etchant and wax may then be removed. In an embodiment where the entire surface of the window 114 is to be frosted, the application of wax may be omitted. It is to be noted that the amount of etching, and thus, the extent of frosting, may be adjusted by utilizing stronger acids and/or longer exposure times. A greater extent of frosting of the window 114 generally results in a greater reduction of light transmission through the frosted area. Additionally or alternatively, it is contemplated that the light-diffusing structure 380 may be formed by disposing a mask over the window 114, and sandblasting the exposed areas of the window 114.

In another embodiment, a frosted glass may be formed by depositing one or more particulates on a surface of an optically transparent member to facilitate light diffusion, and then optionally sintering the deposited particulates. For example, a silicon-boron mix, silica, or the like may be deposited on an optically transparent member, such as window 114, and then sintered. Additionally or alternatively, a glass solder may be disposed on the surface of an optically transparent member and then sintered. In such an example, if the particulates are deposited on the top surface of the window 114, the particulates may be inert with respect to the processing atmosphere.

While embodiments herein generally describe light diffusing structures formed on an optically-transparent window, it is contemplated that the light diffusing structures may be formed on a separate optical element which is then positioned on or near the optically-transparent window. In such an embodiment, retrofitting of existing optically transparent windows is facilitated. Moreover, in such as embodiment, reversibility is also facilitated. For example, in FIG. 2A, the light diffusing structures 280A may be separate elements from the window 114. In another example, the light diffusing structure 380 shown in FIG. 3 may be formed on a separate optical element, such as an optically transparent member, which is then positioned over, under, or in contact with the window 114.

Benefits of the disclosure generally include more uniform irradiation of a substrate during thermal processing. The more uniform irradiation results in a more uniform substrate temperature, thus increasing the uniformity of the processed substrate.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
a chamber body;
a substrate support positioned within the chamber body and adapted to support a substrate in a support plane;
a radiant heat source disposed within the chamber body to direct radiant heat towards the support plane, the radiant heat source comprising a plurality of tubes disposed in a hexagonal arrangement; and
an optically transparent window disposed between the support plane and the radiant heat source, the optically transparent window comprising a plurality of light-diffusing structures disposed on a bottom surface thereof, the plurality of light-diffusing structures comprising a frosted surface of the optically transparent window or one or more Fresnel lenses, wherein each tube of the plurality of tubes is positioned between the light-diffusing structures.

2. The processing chamber of claim 1, wherein the plurality of light-diffusing structures is the frosted surface of the optically transparent window.

3. The processing chamber of claim 2, wherein the frosted surface of the optically transparent window is adjacent the substrate support.

4. The processing chamber of claim 2, wherein the frosted surface of the optically transparent window is adjacent the radiant heat source.

5. The processing chamber of claim 1, wherein the plurality of light-diffusing structures is the one or more Fresnel lenses.

6. A processing chamber, comprising:
a chamber body;
a substrate support positioned within the chamber body and adapted to support a substrate in a support plane;
a radiant heat source disposed within the chamber body beneath the support plane, the radiant heat source comprising a plurality of tubes disposed in a hexagonal arrangement; and
an optically transparent window disposed between the support plane and the radiant heat source, the optically transparent window comprising a plurality of light-diffusing structures disposed on a bottom surface thereof, the plurality of light-diffusing structures comprising a frosted surface of the optically transparent window or one or more Fresnel lenses, wherein each tube of the plurality of tubes is positioned between the light-diffusing structures.

7. The processing chamber of claim 6, wherein the plurality of light-diffusing structures is the frosted surface of the optically transparent window.

8. The processing chamber of claim 6, wherein the optically transparent window includes at least one light-diffusing structure on a first side thereof, and a second light-diffusing structure on a second side opposite the first side.

9. The processing chamber of claim 6, wherein the plurality of light-diffusing structures comprises multiple, discrete light-diffusing structures.

10. The processing chamber of claim 6, wherein the plurality of light-diffusing structures is the one or more Fresnel lenses.

11. A processing chamber, comprising:
a chamber body;
a substrate support positioned within the chamber body;
a radiant heat source disposed within the chamber body to direct radiant heat towards the substrate support, the radiant heat source comprising a plurality of tubes disposed in a hexagonal arrangement; and
an optically transparent window disposed between the substrate support and the radiant heat source, the optically transparent window comprising a plurality of light-diffusing structures disposed on a bottom surface thereof the plurality of light-diffusing structures comprising a frosted surface of the optically transparent window or one or more Fresnel lenses, wherein each of the tubes is positioned between the light-diffusing structures.

12. The processing chamber of claim 11, wherein the plurality of light-diffusing structures is the one or more Fresnel lenses.

13. The processing chamber of claim 11, wherein the plurality of light-diffusing structures is the frosted surface.

* * * * *